United States Patent [19]
Forouhi et al.

[11] Patent Number: 5,763,898
[45] Date of Patent: Jun. 9, 1998

[54] ABOVE VIA METAL-TO-METAL ANTIFUSES INCORPORATING A TUNGSTEN VIA PLUG

[75] Inventors: Abdul R. Forouhi, San Jose; Frank W. Hawley, Campbell; John L. McCollum, Saratoga; Yeouchung Yen, San Jose, all of Calif.

[73] Assignee: Actel Corporation, Sunnyvale, Calif.

[21] Appl. No.: 726,347

[22] Filed: Oct. 3, 1996

Related U.S. Application Data

[63] Continuation of Ser. No. 284,054, Aug. 1, 1994, Pat. No. 5,614,756, which is a continuation-in-part of Ser. No. 790,366, Nov. 12, 1991, Pat. No. 5,404,029, Ser. No. 947,275, Sep. 18, 1992, Pat. No. 5,387,812, Ser. No. 172,132, Dec. 21, 1993, Pat. No. 5,381,055, Ser. No. 197,102, Feb. 15, 1994, abandoned, Ser. No. 50,744, Apr. 20, 1993, abandoned, Ser. No. 4,912, Jan. 19, 1993, Pat. No. 5,411,917, and Ser. No. 231,634, Apr. 22, 1994, Pat. No. 5,552,627, which is a continuation-in-part of Ser. No. 4,912, which is a continuation-in-part of Ser. No. 604,779, Oct. 26, 1990, Pat. No. 5,181,096, said Ser. No. 947,275, is a division of Ser. No. 743,261, Aug. 9, 1991, Pat. No. 5,272,101, which is a continuation-in-part of Ser. No. 604,779, which is a continuation-in-part of Ser. No. 508,306, Apr. 12, 1990, Pat. No. 5,070,384, said Ser. No. 172,132, is a continuation-in-part of Ser. No. 950,264, Sep. 23, 1992, abandoned, said Ser. No. 50,744, is a continuation of Ser. No. 749,866, Aug. 26, 1991, abandoned, said Ser. No. 197,102, is a continuation of Ser. No. 950,264.

[51] Int. Cl.⁶ .................................................. H01L 29/38
[52] U.S. Cl. .............................................. 257/50; 257/530
[58] Field of Search ........................................ 257/50, 530

[56] References Cited

U.S. PATENT DOCUMENTS

| | | | |
|---|---|---|---|
| 3,634,929 | 1/1972 | Yoshida et al. | 29/577 |
| 3,675,090 | 7/1972 | Neale | 317/234 |
| 3,717,852 | 2/1973 | Abbas et al. | 340/173 |
| 3,877,049 | 4/1975 | Buckley | 357/2 |
| 4,261,763 | 4/1981 | Kumar et al. | 148/1.5 |

(List continued on next page.)

FOREIGN PATENT DOCUMENTS

| | | |
|---|---|---|
| 0 081 226 | 6/1983 | European Pat. Off. . |
| 0 092 871 | 11/1983 | European Pat. Off. . |
| 0 162 529 | 11/1985 | European Pat. Off. . |
| 0 224 418 | 6/1987 | European Pat. Off. . |
| 0 315 421 | 5/1989 | European Pat. Off. . |

(List continued on next page.)

OTHER PUBLICATIONS

Chapman et al., "A Laser Linking Process for Restructable VLSI", CLEO '82, Phoenix, Arizona, Apr. 14–16, 1982.

(List continued on next page.)

*Primary Examiner*—Tom Thomas
*Assistant Examiner*—David B. Hardy
*Attorney, Agent, or Firm*—D'Alessandro & Ritchie

[57] ABSTRACT

According to a first aspect of the present invention an antifuse structure capable of high density fabrication comprises an antifuse material layer under a plug of an electrically conductive material disposed between two metallization layers. According to a second aspect of the present invention an antifuse structure capable of high density fabrication comprises an antifuse material layer comprising a first nitride/first amorphous silicon/second nitride/second amorphous silicon sandwich under a plug of an electrically conductive material lined with titanium disposed between two metallization layers. In this aspect of the invention the titanium is allowed to react with the second amorphous silicon layer to form an electrically conductive silicide. This leaves the first nitride/first amorphous silicon/second nitride as the antifuse material layer while guaranteeing a strict control on the thickness of the antifuse material layer for assuring strict control over its respective breakdown or programming voltage. According to a third aspect of the present invention an antifuse structure capable of high density fabrication comprises an antifuse material layer disposed over a plug of an electrically conductive material disposed between two metallization layers.

8 Claims, 2 Drawing Sheets

U.S. PATENT DOCUMENTS

| | | | |
|---|---|---|---|
| 4,271,582 | 6/1981 | Shirai et al. | 29/571 |
| 4,322,822 | 3/1982 | McPherson | 365/182 |
| 4,323,986 | 4/1982 | Malaviya | 365/174 |
| 4,357,622 | 11/1982 | Magdo et al. | 357/44 |
| 4,361,599 | 11/1982 | Wourms | 427/90 |
| 4,420,820 | 12/1983 | Preedy | 365/105 |
| 4,424,578 | 1/1984 | Miyamoto | 365/104 |
| 4,441,247 | 4/1984 | Gargini et al. | 29/571 |
| 4,455,495 | 6/1984 | Masuhara et al. | 307/44 |
| 4,489,481 | 12/1984 | Jones | 29/591 |
| 4,499,557 | 2/1985 | Holmberg et al. | 365/163 |
| 4,507,756 | 3/1985 | McElroy | 365/104 |
| 4,507,757 | 3/1985 | McElroy | 365/104 |
| 4,535,528 | 8/1985 | Chen et al. | 29/571 |
| 4,565,712 | 1/1986 | Noguchi et al. | 427/53.1 |
| 4,569,120 | 2/1986 | Stacy et al. | 29/574 |
| 4,569,121 | 2/1986 | Lim et al. | 29/574 |
| 4,585,490 | 4/1986 | Raffel et al. | 148/1.5 |
| 4,590,589 | 5/1986 | Gerzberg | 365/100 |
| 4,602,420 | 7/1986 | Saito | 29/571 |
| 4,617,723 | 10/1986 | Mukai | 29/576 |
| 4,628,590 | 12/1986 | Udo et al. | 29/575 |
| 4,647,340 | 3/1987 | Szluk et al. | 156/662 |
| 4,651,409 | 3/1987 | Ellsworth et al. | 29/576 |
| 4,732,865 | 3/1988 | Evans et al. | 437/12 |
| 4,740,485 | 4/1988 | Sharpe-Geisler | 437/246 |
| 4,748,490 | 5/1988 | Hollingsworth | 357/51 |
| 4,751,197 | 6/1988 | Wills | 437/174 |
| 4,792,835 | 12/1988 | Sacarisen et al. | 357/23.6 |
| 4,795,722 | 1/1989 | Welch et al. | 437/192 |
| 4,796,074 | 1/1989 | Roesner | 357/51 |
| 4,796,075 | 1/1989 | Whitten | 357/51 |
| 4,800,176 | 1/1989 | Kakumu et al. | 437/193 |
| 4,822,753 | 4/1989 | Pintchovski et al. | 437/192 |
| 4,823,181 | 4/1989 | Mohsen et al. | 357/51 |
| 4,847,732 | 7/1989 | Stopper et al. | 361/395 |
| 4,876,220 | 10/1989 | Mohsen et al. | 437/170 |
| 4,881,114 | 11/1989 | Mohsen et al. | 357/54 |
| 4,882,611 | 11/1989 | Blech et al. | 357/51 |
| 4,893,167 | 1/1990 | Boudou et al. | 357/51 |
| 4,899,205 | 2/1990 | Hamdy et al. | 357/51 |
| 4,907,064 | 3/1990 | Yamazaki et al. | 257/649 |
| 4,910,418 | 3/1990 | Graham et al. | 307/465 |
| 4,912,066 | 3/1990 | Wills | 437/173 |
| 4,914,055 | 4/1990 | Gordon et al. | 437/192 |
| 4,916,809 | 4/1990 | Boudou et al. | 29/852 |
| 4,920,072 | 4/1990 | Keller et al. | 437/192 |
| 4,933,898 | 6/1990 | Gilberg et al. | 365/53 |
| 4,937,475 | 6/1990 | Rhodes et al. | 307/465 |
| 4,943,538 | 7/1990 | Mohsen et al. | 437/52 |
| 4,949,084 | 8/1990 | Schwartz et al. | 340/825.83 |
| 4,981,813 | 1/1991 | Bryant et al. | 437/73 |
| 5,010,039 | 4/1991 | Ku et al. | 437/228 |
| 5,021,849 | 6/1991 | Pfiester et al. | 357/23.5 |
| 5,059,555 | 10/1991 | Iranmanesh et al. | 437/192 |
| 5,061,646 | 10/1991 | Sivan et al. | 437/31 |
| 5,070,384 | 12/1991 | McCollum et al. | 357/51 |
| 5,087,591 | 2/1992 | Teng | 437/225 |
| 5,087,958 | 2/1992 | Chen et al. | 357/51 |
| 5,093,711 | 3/1992 | Hirakawa | 357/71 |
| 5,095,362 | 3/1992 | Roesner | 357/23.4 |
| 5,100,827 | 3/1992 | Lytle | 437/52 |
| 5,106,773 | 4/1992 | Chen et al. | 437/51 |
| 5,110,754 | 5/1992 | Lowrey et al. | 437/52 |
| 5,121,184 | 6/1992 | Huang et al. | 357/34 |
| 5,126,290 | 6/1992 | Lowrey et al. | 437/235 |
| 5,134,457 | 7/1992 | Hamdy et al. | 357/51 |
| 5,163,180 | 11/1992 | Eltoukhy et al. | 257/530 |
| 5,166,556 | 11/1992 | Hsu et al. | 307/465 |
| 5,166,901 | 11/1992 | Shaw et al. | 365/105 |
| 5,171,715 | 12/1992 | Husher et al. | 437/195 |
| 5,181,096 | 1/1993 | Forouhi | 257/530 |
| 5,196,724 | 3/1993 | Gordon et al. | 257/530 |
| 5,210,598 | 5/1993 | Nakazaki et al. | 257/530 |
| 5,233,217 | 8/1993 | Dixit et al. | 257/530 |
| 5,242,851 | 9/1993 | Choi | 437/49 |
| 5,248,632 | 9/1993 | Tung et al. | 437/195 |
| 5,258,643 | 11/1993 | Cohen | 257/530 |
| 5,266,829 | 11/1993 | Hamdy et al. | 257/530 |
| 5,272,101 | 12/1993 | Forouhi et al. | 437/50 |
| 5,272,369 | 12/1993 | Colinge et al. | 257/352 |
| 5,272,666 | 12/1993 | Tsang et al. | 365/96 |
| 5,290,734 | 3/1994 | Boardman et al. | 437/195 |
| 5,298,784 | 3/1994 | Gambino et al. | 257/529 |
| 5,300,456 | 4/1994 | Tigelaar et al. | 437/195 |
| 5,308,795 | 5/1994 | Hawley et al. | 437/195 |
| 5,318,924 | 6/1994 | Lin et al. | 437/192 |
| 5,319,238 | 6/1994 | Gordon et al. | 257/530 |
| 5,322,812 | 6/1994 | Dixit et al. | 437/60 |
| 5,381,035 | 1/1995 | Chen et al. | 257/530 |
| 5,412,245 | 5/1995 | Favreau | 257/530 |
| 5,427,979 | 6/1995 | Chang | 437/190 |
| 5,440,167 | 8/1995 | Iranmanesh | 257/530 |
| 5,447,880 | 9/1995 | Lee et al. | 437/60 |
| 5,449,947 | 9/1995 | Chen et al. | 257/530 |
| 5,464,790 | 11/1995 | Hawley | 437/60 |
| 5,493,146 | 2/1996 | Pramanik et al. | 257/530 |
| 5,493,147 | 2/1996 | Holzworth et al. | 257/530 |
| 5,514,900 | 5/1996 | Iranmanesh | 257/530 |
| 5,521,440 | 5/1996 | Iranmanesh | 257/774 |
| 5,557,136 | 9/1996 | Gordon et al. | 257/530 |
| 5,565,703 | 10/1996 | Chang | 257/530 |
| 5,572,050 | 11/1996 | Cohen | 257/209 |
| 5,572,062 | 11/1996 | Iranmanesh | 257/530 |
| 5,573,970 | 11/1996 | Pramanik et al. | 437/60 |
| 5,573,971 | 11/1996 | Cleeves | 437/60 |
| 5,576,576 | 11/1996 | Hawley et al. | 257/530 |
| 5,587,613 | 12/1996 | Iranmanesh | 257/530 |
| 5,592,016 | 1/1997 | Go et al. | 257/530 |
| 5,593,920 | 1/1997 | Haslam et al. | 437/195 |
| 5,602,053 | 2/1997 | Zheng et al. | 257/530 |

FOREIGN PATENT DOCUMENTS

| | | |
|---|---|---|
| 0 323 078 | 7/1989 | European Pat. Off. . |
| 0 414 361 | 2/1991 | European Pat. Off. . |
| 0 416 903 | 3/1991 | European Pat. Off. . |
| 0 436 387 | 7/1991 | European Pat. Off. . |
| 0 452 091 | 10/1991 | European Pat. Off. . |
| 0 455 414 | 11/1991 | European Pat. Off. . |
| 0 500 034 | 8/1992 | European Pat. Off. . |
| 0 501 120 | 9/1992 | European Pat. Off. . |
| 0 501 687 | 9/1992 | European Pat. Off. . |
| 0 529 820 | 3/1993 | European Pat. Off. . |
| 0 592 078 | 4/1994 | European Pat. Off. . |
| 0 599 388 | 6/1994 | European Pat. Off. . |
| 0 602 836 | 6/1994 | European Pat. Off. . |
| 0 603 105 | 6/1994 | European Pat. Off. . |
| 0 660 408 | 6/1995 | European Pat. Off. . |
| 0 661 745 | 7/1995 | European Pat. Off. . |
| 0 671 767 | 9/1995 | European Pat. Off. . |
| 0 684 646 | 11/1995 | European Pat. Off. . |
| 3 927 033 | 8/1989 | Germany . |
| 3-179763 | 8/1991 | Japan . |
| 5-074947 | 3/1993 | Japan . |
| 5-029466 | 6/1993 | Japan . |
| 5-090411 | 8/1993 | Japan . |
| 5-090412 | 8/1993 | Japan . |
| 5-090413 | 8/1993 | Japan . |
| 5-121554 | 9/1993 | Japan . |
| 5-121556 | 9/1993 | Japan . |
| 5-166761 | 10/1993 | Japan . |
| 6-045461 | 2/1994 | Japan . |

| | | |
|---|---|---|
| 6-163702 | 6/1994 | Japan . |
| 6-169017 | 6/1994 | Japan . |
| 6-302701 | 10/1994 | Japan . |
| 6-509444 | 10/1994 | Japan . |
| 6-510634 | 11/1994 | Japan . |
| 6-511352 | 12/1994 | Japan . |
| 7-176703 | 7/1995 | Japan . |
| 7-183386 | 7/1995 | Japan . |
| 7-326675 | 12/1995 | Japan . |
| 85/03599 | 8/1985 | WIPO . |
| 87/00969 | 2/1987 | WIPO . |
| 87/02827 | 5/1987 | WIPO . |
| 92/13359 | 8/1992 | WIPO . |
| 92/20109 | 11/1992 | WIPO . |
| 92/21154 | 11/1992 | WIPO . |
| 92/22088 | 12/1992 | WIPO . |
| 93/03499 | 2/1993 | WIPO . |
| 93/05514 | 3/1993 | WIPO . |
| 94/05041 | 3/1994 | WIPO . |

OTHER PUBLICATIONS

Burns, "Titanium Dioxide Dielectric Films Formed by Rapid Thermal Oxidation", Mar. 1989, Journal of Applied Physics, vol. 65, No. 5, pp. 2095–2097.

Chen, "A Sublithographic Antifuse Structure for Field–Programmable Gate Array Applications", Jan. 1992, IEEE, Electron Device Letters, vol. 13, No. 1, pp. 53–55.

Chiang, "Antifuse Structure Comparison for Field Programmable Gate Arrays", 1992, IEEE, IEDM, pp. 611–614.

Cohen, "A Flat–Aluminum Based Voltage–Programmable Link for Field–Programmable Devices", May 1994, IEEE, Transactions on Electron Devices, vol. 41, No. 5, pp. 721–724.

Cook, "Amorphous Silicon Antifuse Technology for Bipolar PROMS", 1986, IEEE, Bipolar Circuits and Technology Meeting, pp. 99–100.

Ghandhi, "VLSI Fabrication Principles, Silicon and Gallium Arsenide", John Wiley & Sons.

Gordon, "Conducting Filament of the Programmed Metal Electrode Amorphous Silicon Antifuse", 1993, IEEE, IEDM, pp. 27–30.

Hamdy, "Dielectric Based Antifuse for Logic and Memory ICs", 1988, IEEE, IEDM, pp. 786–789.

Hu, "Interconnect Devices for Field Programmable Gate Array", 1992, IEEE, IEDM, pp. 591–594.

Iseoff, "Characterizing Quickturn ASICs: It's Done with Mirrors", Aug. 1990, Semiconductor International.

Pauleau, "Interconnect Materials for VLSI Circuits", Apr. 1987, Solid State Technology, vol. 30, No. 4, pp. 155–162.

Ravindhran, "Field Programmable Gate Array (FPGA) Process Design for Multilevel Metallization Technology", Jun. 1993, VMIC Conference, ISMIC–102/93/0062, pp. 62–64.

ABOVE VIA METAL-TO-METAL ANTIFUSES INCORPORATING A TUNGSTEN VIA PLUG

CROSS-REFERENCES TO RELATED APPLICATIONS

This application is a continuation of U.S. patent application Ser. No. 08/284,054, filed Aug. 1, 1994, now U.S. Pat. No. 5,614,756, which is a continuation-in-part of: (1) U.S. patent application Ser. No. 07/790,366 entitled "Electrically Programmable Antifuse Element", filed Nov. 12, 1991, in the name of inventors John D. Husher and Abdul R. Forouhi, now U.S. Pat. No. 5,404,029, currently pending, of which U.S. patent application Ser. No. 07/888,042 entitled "Electrically Programmable Antifuse Element", filed May 22, 1992, in the name of inventors John D. Husher and Abdul R. Forouhi, now U.S. Pat. No. 5,171,715, is a divisional; (2) U.S. patent application Ser. No. 07/947,275 entitled "Metal-To-Metal Antifuse Structure", filed Sep. 18, 1992, in the name of inventors Abdul R. Forouhi, Esmat Z. Hamdy, Chenming Hu and John L. McCollum, now U.S. Pat. No. 5,387,812, which is a divisional of U.S. patent application Ser. No. 07/743,261 entitled "Electrically Programmable Antifuse and Fabrication Processes", filed Aug. 9, 1991, in the name of inventors Abdul R. Forouhi, Esmat Z. Hamdy, Chenming Hu and John L. McCollum, now U.S. Pat. No. 5,272,101, which is a continuation-in-part of U.S. patent application Ser. No. 07/604,779 entitled "Electrically Programmable Antifuse Incorporating Dielectric and Amorphous Silicon Interlayer", filed Oct. 26, 1990, in the name of inventors Abdul R. Forouhi, John L. McCollum and Shih-Oh Chen, now U.S. Pat. No. 5,181,096, which is a continuation-in-part of U.S. patent application Ser. No. 07/508,306 entitled "Electrically Programmable Antifuse Element Incorporating A Dielectric and Amorphous Silicon Interlayer", filed Apr. 12, 1990, in the name of inventors John L. McCollum and Shih-Oh Chen, now U.S. Pat. No. 5,070,384; (3) U.S. patent application Ser. No. 08/172,132 entitled "Metal-To-Metal Antifuse Including Etch Stop Layer", filed Dec. 21, 1993, in the name of inventors Wenn-Jei Chen, Steve S. Chiang and Frank W. Hawley, now U.S. Pat. No. 5,381,035, which is a continuation-in-part of U.S. patent application Ser. No. 07/950,264 entitled "Antifuse Element and Fabrication Method", filed Sep. 23, 1992, in the name of inventor Frank W. Hawley, now abandoned, of which U.S. patent application Ser. No. 08/197,102 entitled "Antifuse Element and Fabrication Method", filed Feb. 15, 1994, in the name of inventor Frank W. Hawley, now abandoned, is a continuation; (4) U.S. patent application Ser. No. 08/197,102, referred to above; (5) U.S. patent application Ser. No. 08/050,744 entitled "Elevated Metal-To-Metal Antifuse Structures and Fabrication Processes", filed Apr. 20, 1993, in the name of inventors Frank W. Hawley and John L. McCollum, now abandoned, which is a continuation of U.S. patent application Ser. No. 07/749,866 entitled "Elevated Metal-To-Metal Antifuse Structures and Fabrication Processes", filed Aug. 26, 1991, in the name of inventors Frank W. Hawley and John L. McCollum, now abandoned, of which U.S. patent application Ser. No. 07/900,651 entitled "Elevated Metal-To-Metal Antifuse Structures and Fabrication Processes", filed Jun. 18, 1992, in the name of inventors Frank W. Hawley and John L. McCollum, now abandoned, is a divisional; (6) U.S. patent application Ser. No. 08/231,634 entitled "Electrically Programmable Antifuse Incorporating Dielectric and Amorphous Silicon Interlayers", filed Apr. 22, 1994, in the name of inventors John L. McCollum, Eltoukhy Abdelshafy and Abdul R. Forouhi, now U.S. Pat. No. 5,552,627, which is a continuation-in-part of U.S. patent application Ser. No. 08/004,912 entitled "Electrically Programmable Antifuse Incorporating Dielectric and Amorphous Silicon Interlayer", filed Jan. 19, 1993, in the name of inventors Abdul R. Forouhi, John L. McCollum and Shih-Oh Chen, now U.S. Pat. No. 5,411,917, which is a continuation-in-part of U.S. patent application Ser. No. 07/604,779, referred to above; and (7) U.S. patent application Ser. No. 08/004,912, referred to above.

The above-identified patent applications and patents are all owned by Actel Corporation and are all hereby incorporated herein by reference as if set forth fully herein.

BACKGROUND OF THE INVENTION

1. Field of the Invention

This invention relates to an improved metal-to-metal antifuse incorporating an electrically conductive plug and a method of making such a metal-to-metal antifuse.

2. The Prior Art

Field Programmable Gate Arrays (FPGAs) and other modern user programmable semiconductor devices comprise antifuses as programmable elements to effect user programmability of the functions and operation of such devices. Antifuses are generally devices which comprise a pair of electrically conductive layers sandwiched about an insulating antifuse material layer. Application of a voltage in excess of the "programming" or breakdown voltage of the antifuse across the electrically conductive layers causes an electrically conductive filament or "via link" to form in the antifuse layer between the two electrically conductive layers, effectively shorting the two electrically conductive layers together and "programming" the antifuse to an "on-state." An unprogrammed antifuse has no electrically conductive filament connecting the two electrically conductive layers, hence it is in the "off-state."

Antifuses have been fabricated from a number of different electrically conductive layer materials as well as a number of different insulating antifuse materials. Antifuse on-state resistances vary from a few ohms to a few hundred ohms, depending upon the materials and structure used, while the off-state resistances range to a few gigaohms. Programming voltages range from a few volts to about 20 volts.

The programming voltage of an antifuse is essentially a function of the thickness of the antifuse layer. The thinner the layer, the less the programming voltage, the thicker the layer, the higher the programming voltage. Any unpredictability in the thickness of the antifuse layer resulting from the processes used to fabricate the antifuse will translate into an uncertainty in the programming voltage for the fuse as well as an uncertainty in the operating voltages which may safely be used without inadvertently programming the antifuse.

Because antifuses are used to program the functions and operation of FPGAs and other applications of user programmable semiconductor devices, the failure of an antifuse, either due to inadvertent programming or inability to program at the predicted programming voltage can render an entire device inoperative and defective. Others have tried to improve the yield and predictability of antifuses, however, the devices of the prior art remain somewhat unreliable when built to the densities and to be programmed and operate at the lower voltages present in today's semiconductors. This is in large part due to the fact that most metal-to-metal antifuses, which are favored in CMOS compatible processes, are made by opening a via in the dielectric layer and then applying the antifuse layer over and in the via.

The result is a layer of varying thickness which may form cusps in the non-square via. For example, U.S. Pat. No. 5,120,679 to Boardman et al. teaches an antifuse structure having oxide spacer elements to cover cusps formed in the amorphous silicon ("a-Si") insulating antifuse material layer which is applied to an opening in the dielectric layer. Boardman's device, necessarily, has a relatively unpredictable antifuse layer thickness and he attempts to get around this by shielding all but the central portion of the layer in the middle of the via.

More recently, strap-type architectures have become available in the art which allow for a planar antifuse layer, avoiding the problems noted by Boardman et al. In the paper "Field Programmable Gate Array (FPGA) Process Design For Multilevel Metallization Technology" by K. S. Ravindhran et al. presented at the June, 1993 VMIC Conference, the structure disclosed is essentially that set forth in FIG. 1. Turning now to FIG. 1, an antifuse structure 10 similar to that taught by K. S. Ravindhran et al., supra, is shown. A first metallization layer 12 is disposed on an insulating portion of an integrated circuit, such as silicon dioxide. Metallization layer 12 may comprise, for example, TiW. A first amorphous silicon ("a-Si") layer 14 is disposed over TiW layer 12. A dielectric layer, such as a CVD oxide layer 16 is disposed over first a-Si layer 14. A via 18 is opened in oxide layer 16 with an etch gas. The etch process is stopped after the via extends all of the way through oxide layer 16 and partially into first a-Si layer 14 in the region denoted with reference numeral 20. A second metallization layer 22 is disposed over via 18. Second metallization layer 22 may comprise a first layer 24 of a barrier material such as TiW and a second layer 26 of aluminum.

Unfortunately, the antifuse layer is reached by etching an opening in CVD oxide dielectric layer 16. Because the antifuse layer can also be etched by the gases used to etch the dielectric layer, an unpredictable amount of antifuse is also etched away during the process resulting in a somewhat unpredictable thickness for the antifuse layer and a corresponding unpredictable programming voltage. As operating and programming voltages drop to accommodate lower powered devices, the problems presented by this unpredictability grow large.

A further problem is presented by the desire to reduce the size of antifuses to 8000Å (0.8 μ) and smaller. In such small devices, step coverage can become a dominant problem due to the difficulty in depositing a uniform layer within a via or cell opening having a relatively large depth to width ratio.

Accordingly, there is a need for an improved antifuse structure and method for making the same which provides a highly predictable and repeatable programming voltage.

OBJECTS AND ADVANTAGES OF THE INVENTION

Accordingly, it is an object of the present invention to provide an antifuse structure having a highly controllable programming voltage.

It is a further object of the present invention to provide an antifuse structure with a predictable programming voltage.

It is a further object of the present invention to provide a method of making an antifuse structure having a highly controllable programming voltage.

It is a further object of the present invention to provide an antifuse structure which provides a better material sink in conjunction with the antifuse electrodes so that ample material with which to form the antifuse conductive link through the antifuse material layer during antifuse programming.

It is a further object of the present invention to provide an antifuse structure having improved isolation of aluminum metallization layers from the antifuse material layer to prevent unintentional programming of the antifuse.

Yet a further object of the present invention to provide a method of making an antifuse structure with a predictable programming voltage.

Still further it is an object of the present invention to provide a metal-to-metal antifuse incorporating an electrically conductive plug in the via to allow construction of smaller and more predictable antifuses with high current carrying capability.

These and many other objects and advantages of the present invention will become apparent to those of ordinary skill in the art from a consideration of the drawings and ensuing description of the invention.

SUMMARY OF THE INVENTION

According to a first aspect of the present invention an antifuse structure capable of high density fabrication comprises an antifuse material layer under a plug of an electrically conductive material disposed between two metallization layers.

According to a second aspect of the present invention an antifuse structure capable of high density fabrication comprises an antifuse material layer comprising a first nitride/first amorphous silicon/second nitride/second amorphous silicon sandwich under a plug of an electrically conductive material lined with titanium disposed between two metallization layers. In this aspect of the invention the titanium is allowed to react with the second amorphous silicon layer to form an electrically conductive silicide. This leaves the first nitride/first amorphous silicon/second nitride as the antifuse material layer while guaranteeing a strict control on the thickness of the antifuse material layer for assuring strict control over its respective breakdown or programming voltage.

According to a third aspect of the present invention an antifuse structure capable of high density fabrication comprises an antifuse material layer disposed over a plug of an electrically conductive material disposed between two metallization layers.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Throughout this disclosure metallization layers are referred to as first and second. In practice there is no need that a "first metallization layer" as used herein be the lowest metallization layer in a microcircuit structure and, hence, the terminology "first," "second," etc. is only intended to denote order, i.e., the "first metallization layer" is under the "second metallization layer."

Figure 1:
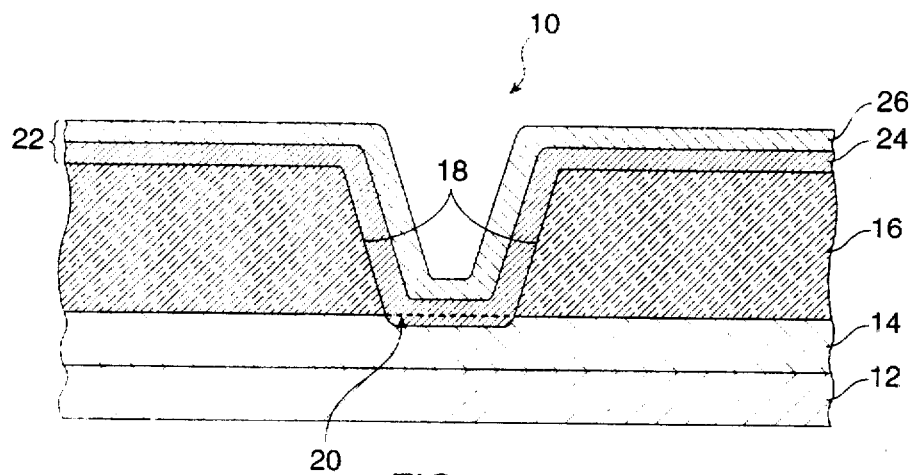
FIG. 1 is a diagram of a prior art antifuse structure.
Figure 2:
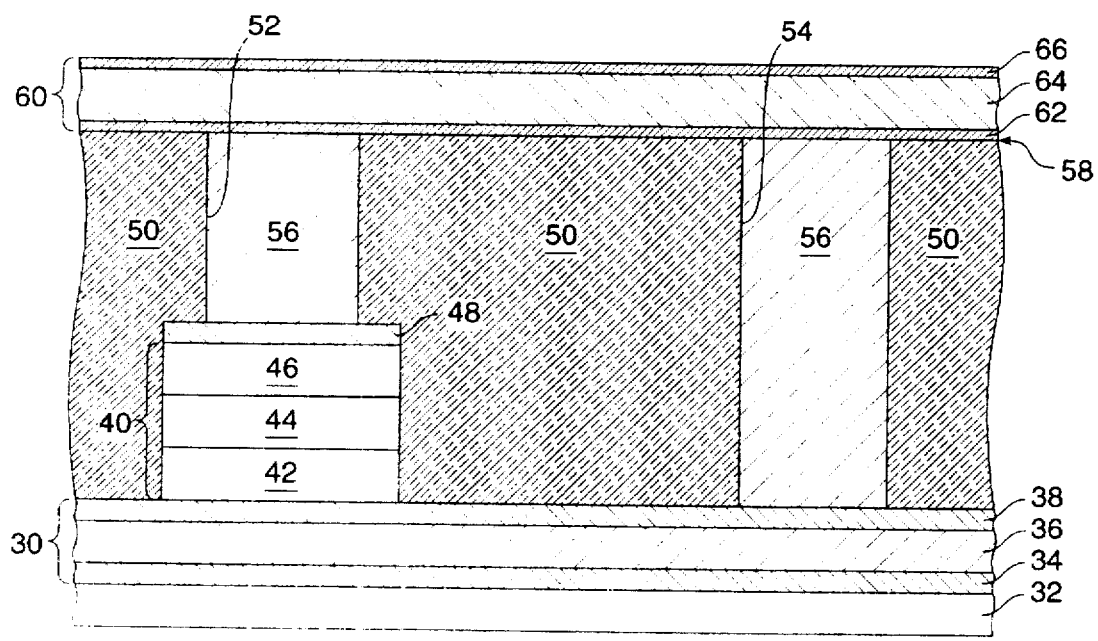
FIG. 2 is a diagram of an antifuse structure according to a first preferred embodiment of the present invention.

Turning now to FIG. 2, an embodiment of the present invention is depicted wherein an N-A-N-type sandwich antifuse structure is disposed below a tungsten plug in a cell opening between two metallization layers.

According to a presently preferred embodiment of the present invention a first metallization layer 30 is disposed over a substrate 32. Substrate 32 may be any insulating layer of an integrated circuit structure such as a silicon dioxide layer in a silicon wafer. First metallization layer 30 preferably comprises a first diffusion barrier layer ("first barrier layer") 34, an aluminum layer 36, and a second diffusion barrier layer ("second barrier layer") 38. First barrier layer 34 is preferably a layer of TiN (Titanium Nitride) of thickness about 300Å (a thickness within the range of 200Å–1000Å would work as well). Other materials could be used instead of TiN such as W (Tungsten), TiW (Titanium-Tungsten), TiWN (Titanium-Tungsten Nitride), TiC (Titanium Carbide), WC (Tungsten Carbide) and any combination of any of the aforementioned materials. Herein, "Ti" refers to titanium. First barrier layer 34 serves to help isolate aluminum layer 36 by preventing diffusion of aluminum from aluminum layer 36 into substrate 32. Aluminum layer 36 is preferably of thickness about 4000Å (a thickness within the range of 3000Å–7000Å, would work as well). Second barrier layer 38 serves to prevent migration of aluminum from aluminum layer 36 into the antifuse structure above. It is preferably a layer of TiN of thickness about 2000Å (a thickness within the range of 1000Å–4000Å would work as well). Other structures and combinations for metallization layer 30 could be used as well, such as the substitution of TiW and like materials for TiN as would be known to those of ordinary skill in the art. Methods for depositing the materials discussed herein to create an integrated circuit structure are commonly known and used in the semiconductor processing industry and will not be re-stated here except where important to the disclosure to avoid over-complicating the disclosure.

Upon the first metallization layer 30 is next disposed an antifuse material layer 40. Antifuse material layer 40 may be any of a number of antifuse materials as are well known to those of ordinary skill in the art, such as amorphous silicon (a-Si), and other dielectric materials. Presently preferred is that antifuse material layer 40 be fabricated of an "N-A-N sandwich" comprising a first nitride layer 42 (silicon nitride), an a-Si layer 44 (amorphous silicon) and a second nitride layer 46 (silicon nitride). According to this embodiment, first nitride layer 42 is preferably of thickness 30Å–300Å with 100Å presently preferred; a-Si layer 44 is preferably of thickness 100Å–1000Å with 400Å presently preferred; and second nitride layer 46 is preferably of thickness 30Å–300Å with 100Å presently preferred. On top of antifuse material layer 40 is preferably deposited etch-stop layer 48 over which a photoresist layer (not shown) is deposited in a conventional manner which defines where the antifuses will be located. Etch-stop layer 48 should be electrically conductive so that an electrical connection between the top of the antifuse material layer 40 and the second metallization layer may be facilitated. Presently preferred for etch-stop layer 48 is a layer of TiN of thickness in the range of 200Å–3000Å with 500Å presently preferred. The antifuse material layer(s) is then etched back to the first metallization layer where not protected by the photo-resist layer (not shown). The photo-resist layer is subsequently removed in the conventional manner.

Next, an interlayer dielectric layer 50 (ILD) of thickness in the range of 3000Å–10000Å with 6000Å presently preferred is laid down, preferably with a PECVD process. Presently preferred for the ILD is a PECVD oxide, although other materials and processes could be used as known by those of skill in the art.

After completion of ILD 50, two types of cell openings or "vias" may be made in ILD 50 for further processing. Via 52 represents a first type of cell opening through the top of ILD 50 down to etch-stop layer 48. Preferably the width of cell opening 52 is less than the width of the antifuse material layer stack 40 remaining after etch-back. Preferably the cell openings are of diameter 8000Å (0.8μ) or less. Via 54 represents a second type of cell opening through the entire thickness of ILD 50 as shown to provide access to first metallization layer 30. Preferably these cell openings are also of diameter 8000Å (0.8μ) or less.

The next step involves depositing an electrically conductive material 56 ("plug") within the cell openings in order to provide an electrically conductive link to the second metallization layer yet to be deposited. Presently preferred is CVD tungsten, a commercially available process which can be used to fill vias 52 and 54. CVD tungsten adheres nicely to the TiN at layer 38 and layer 48 and may be chem-mechanically polished along with ILD 50 to provide a planar surface 58 upon which further processing may take place. Other electrically conductive materials for which CVD processes are or become available may be used in place of CVD tungsten. Moreover, although not presently preferred to CVD tungsten, sputter deposition may also be used in place of CVD tungsten to deposit desired electrically conductive materials within vias 52 and 54. Such methods are known to those of ordinary skill in the art and include the use of collimators for sputtering materials such as TiN, W, TiW, TiWN, TiC, WC and the like.

Upon planarized surface 58 is disposed second metallization layer 60. As discussed before, a number of configurations may be used as known to those of ordinary skill in the art, however, presently preferred is a three layer sandwich of a barrier layer 62, an aluminum layer 64 and an antireflective coating ("ARC") layer 66. Barrier layer 62 is deposited to block diffusion of aluminum from the aluminum layer 64 to CVD tungsten layer 56. Presently preferred for barrier layer 62 is a layer of TiN of thickness in the range of 200Å–1000Å with 300Å presently preferred. Other materials could be used instead of TiN such as W, TiW, TiWN, TiC, WC and any combination of any of the aforementioned materials. Aluminum layer 64 is preferably of thickness about 4000Å (a thickness within the range of 3000Å–7000Å would work as well). ARC layer 66 is a layer of TiN of thickness in the range of 200Å–1000Å with 500Å presently preferred. Further processing may be carried out above ARC layer 66 or the structure may be capped with an appropriate passivation layer as known to those of ordinary skill in the art.

Figure 3:
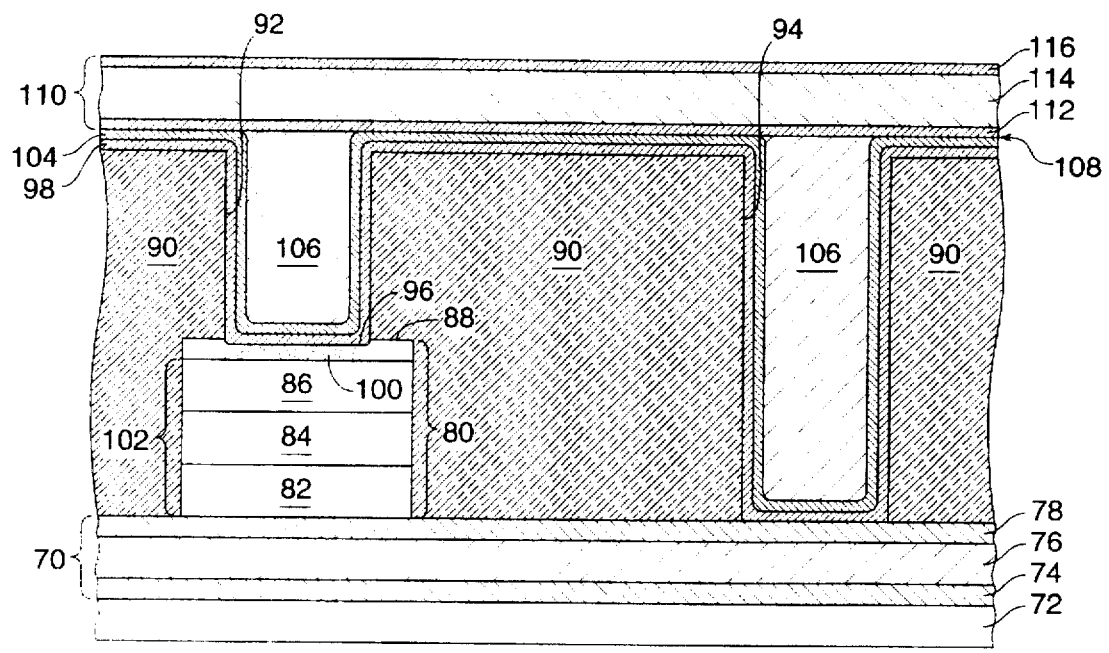
FIG. 3 is a diagram of an antifuse structure according to a second preferred embodiment of the present invention.

Turning now to FIG. 3, an embodiment of the present invention is depicted wherein an "N-A-N-A sandwich" antifuse structure is disposed below a tungsten plug in a cell opening between two metallization layers.

According to a presently preferred embodiment of the present invention a first metallization layer 70 is disposed over a substrate 72. Substrate 72 may be any insulating layer of an integrated circuit structure. First metallization layer 70 preferably comprises a first barrier layer 74, an aluminum layer 76, and a second barrier layer 78. First barrier layer 74 is preferably a layer of TiN (Titanium Nitride) of thickness about 300Å (a thickness within the range of 200–1000Å would work as well). Other materials could be used instead of TiN such as W, TiW, TiWN, TiC, WC and any combination of any of the aforementioned materials. First barrier layer 74 serves to help isolate aluminum layer 76 from substrate 72. Aluminum layer 76 is preferably of thickness about 4000Å (a thickness within the range of 3000Å–7000Å would work as well). Second barrier layer 78 serves to prevent migration of aluminum from aluminum layer 76 into the antifuse structure above. It is preferably a layer of TiN of thickness about 2000Å (a thickness within the range of 1000Å–4000Å would work as well). Other structures and combinations for metallization layer 70 could be used as well, such as the substitution of TiW and like materials for TiN as would be known to those of ordinary skill in the art.

Upon the first metallization layer 70 is next disposed an antifuse material layer 80. Antifuse material layer 80 may be any of a number of antifuse materials as are well known to those of ordinary skill in the art, such as amorphous silicon (a-Si), and other dielectric materials. Presently preferred is that antifuse material layer 80 be fabricated of an N-A-N-A sandwich comprising a first nitride layer 82, a first a-Si layer 84, a second nitride layer 86 and a second a-Si layer 88. According to this embodiment, first nitride layer 82 is preferably of thickness 30Å–300Å with 100Å presently preferred; first a-Si layer 84 is preferably of thickness 100Å–1000Å with 400Å presently preferred; second nitride layer 86 is preferably of thickness 30Å–300Å with 100Å presently preferred; and second a-Si layer 88 is preferably of thickness 50Å–1000Å with 350Å presently preferred.

Now, the antifuse material layer 80 is patterned and etched using a standard photoresist layer (not shown) which defines the location of the antifuse material layer 80 which will form a part of the antifuses.

On top of antifuse material layer 80 is disposed an ILD layer 90 of thickness in the range of 3000Å–10000Å with 6000Å, of oxide presently preferred. A PECVD process is presently preferred for deposition of the ILD oxide. Other materials and processes could be used for the ILD as known by those of skill in the art.

After completion of ILD 90, two types of cell openings or "vias" may be made in ILD 90 for further processing. Via 92 represents a first type of cell opening through the top of ILD 90 down to and partially into second a-Si layer 88 (which acts as an etch-stop layer). Preferably the width of cell opening 92 is less than the width of the antifuse material layer stack 80. Preferably the cell openings are of diameter 8000Å (0.8μ) or less. Via 94 represents a second type of cell opening through the entire thickness of ILD 90 as shown to provide access to first metallization layer 70. Preferably these cell openings are also of diameter 8000Å (0.8μ) or less.

Via 92 is opened in dielectric layer 90 by etching with an etch gas according to methods well known to those of ordinary skill in the art and accordingly not set forth here. Since such etching is difficult to control precisely, in order to completely open via 92 through the entirety of dielectric layer 90, some portion of second a-Si layer 88 will also inevitably be etched. This etched portion is shown by reference numeral 96 as an indentation in second a-Si layer 88. The portion of second a-Si layer 88 immediately adjacent via 92 may now be less thick than before the etching process was carried out. If nothing were done about this, the programming voltage necessary to program the antifuse material layer 80 would be unpredictable as it would be a function of the indeterminate etching of second a-Si layer 88. The following process removes this unpredictability. It is also to be noted that accordingly, the antifuse material layer may also be referred to herein as comprising layers 82, 84 and 86 and not 88 once this process has been carried out.

A layer 98 of Ti is next disposed over via 92. Ti layer 98 is preferably 500Å thick and may preferably range in thickness from 100Å to 3000Å. Ti layer 98 is now allowed to thermally react with second a-Si layer 88 as follows:

The thermal reaction of Ti layer 98 and second a-Si layer 88 is self-limiting and ends when the entire thickness of second a-Si layer 88 has been turned to a titanium silicide. The result of the thermal reaction between Ti layer 98 and second a-Si layer 88 is the formation of a region 100 of titanium silicide (shown stippled in FIG. 3) which is electrically conductive and extends downward to stop at the top of second nitride layer 86. Accordingly, the insulating antifuse material layer 80 now comprises N-A-N (Nitride/a-Si/Nitride) layers 82, 84, 86 with second a-Si layer 88 (now including Ti-silicide region 100) in effect forming a part of the second metallization layer and thus its unpredictable thickness plays no role in determining the breakdown voltage of the remainder of antifuse material layer (layers 82, 84 and 86).

On top of Ti layer 98 is disposed a barrier layer 104 of TiN of thickness in the range of 500Å–5000Å with 1000Å presently preferred. Then, as discussed above, CVD tungsten 106 or another suitable electrically conductive material is disposed within vias 92 and 94 to fill them, then a chem-mechanical polishing or other suitable planarizing step is performed to provide a planar surface 108 for further processing. As shown in FIG. 3, Ti layer 98 and TiN layer 104 remain disposed over ILD 90 after chem-mechanical polishing. This is not required and they may be polished down to the ILD or in any other manner, as desired.

Upon planarized surface 108 is disposed second metallization layer 110. As discussed before, a number of configurations may be used as known to those of ordinary skill in the art, however, presently preferred is a three layer sandwich of a barrier layer 112, an aluminum layer 114 and an ARC layer 116. Barrier layer 112 is disposed to help prevent the diffusion of the aluminum from aluminum layer 114 to layer 106. Where layer 106 is CVD TiN, then no barrier layer 112 is needed. Presently preferred for barrier layer 112 is a layer of TiN of thickness in the range of 200Å–1000Å with 300Å presently preferred. Other materials could be used instead of TiN such as W, TiW, TiWN, TiC, WC and any combination of any of the aforementioned materials. Aluminum layer 114 is preferably of thickness about 4000Å (a thickness within the range of 3000Å–7000Å would work as well). ARC layer 116 is a layer of TiN of thickness in the range of 200Å–1000Å with 500Å presently preferred. Further processing may be carried out above ARC layer 116 or the structure may be capped with an appropriate passivation layer as known to those of ordinary skill in the art.

A key advantage to the embodiment just described over other embodiments is reduced capacitance and hence enhanced ability to operate at higher speeds. In FIG. 3 the region 100 functions as the top antifuse electrode whereas in the FIG. 2 embodiment the region 48 functions as the top antifuse electrode. Region 100 provides less capacitance than layer 48 because it is smaller in that it extends only in a region immediately below the titanium layer which reacted with the insulating a-Si to form the conducting electrode. On the other hand, layer 48 tends to present a larger area and hence a larger capacitance due to the overlapping regions of layer 48 which extend to the right and to the left of via 52 as shown in FIG. 2.

According to another preferred embodiment of the present invention, insulating antifuse layer 80 may instead comprise a first layer of amorphous silicon disposed on first metallization layer 70 and a second layer of an insulating material (other than amorphous silicon) disposed on the first layer of amorphous silicon. Preferably the second layer of insulating material is silicon nitride. In this embodiment the SiN (Silicon Nitride) layer acts as an etch stop for via 92 and the extra processing steps for deposition of the titanium layer 98 used for creation of the silicide are unnecessary.

Figure 4:
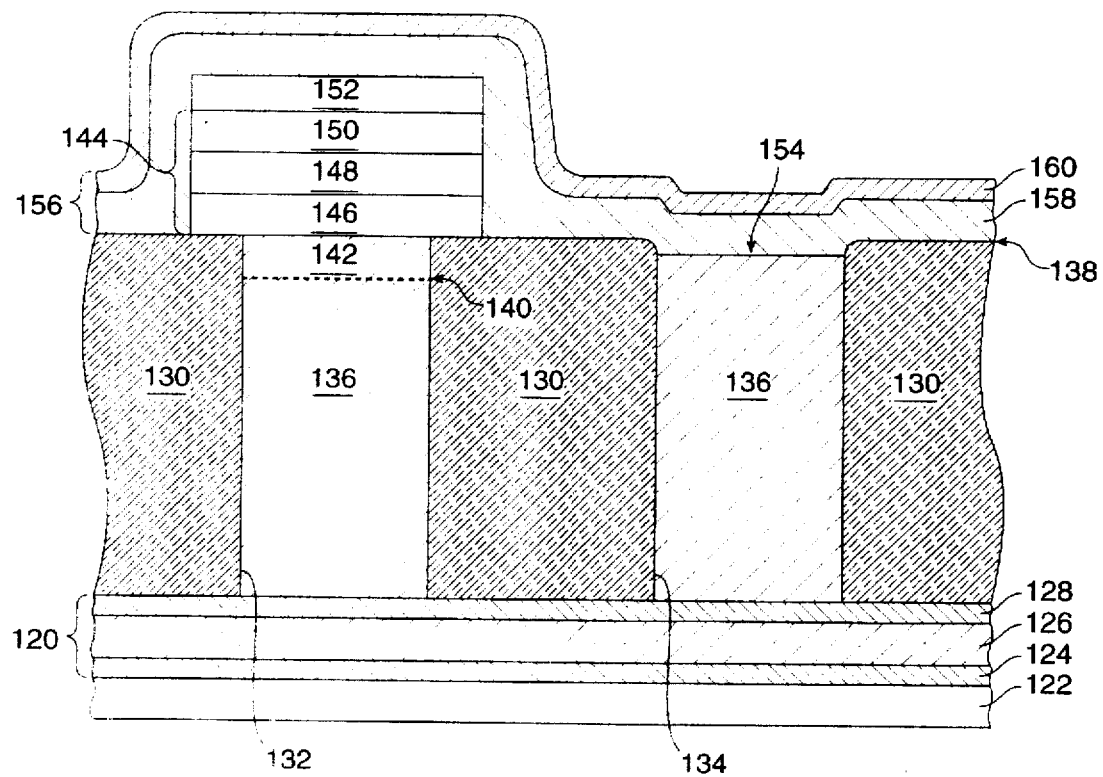
FIG. 4 is a diagram of an antifuse structure according to a third preferred embodiment of the present invention.

Turning now to FIG. 4, an embodiment of the present invention is depicted wherein an N-A-N-type sandwich antifuse structure is disposed above a tungsten plug in a cell opening between two metallization layers.

According to a presently preferred embodiment of the present invention a first metallization layer 120 is disposed over a substrate 122. Substrate 122 may be any insulating layer of an integrated circuit structure. First metallization layer 120 preferably comprises a first barrier layer 124, an aluminum layer 126, and a second barrier layer 128. First barrier layer 124 is preferably a layer of TiN of thickness about 300Å (a thickness within the range of 200Å–1000Å would work as well). Other materials could be used instead of TiN such as W, TiW, TiWN, TiC, WC and any combination of any of the aforementioned materials. First barrier layer 124 serves primarily to isolate aluminum layer 126 from substrate 122. Aluminum layer 126 is preferably of thickness about 4000Å (a thickness within the range of 3000Å–7000Å would work as well). Second barrier layer 128 also serves to help bond the ILD and CVD tungsten to aluminum layer 126. It is preferably a layer of TiN of thickness about 2000Å (a thickness within the range of 1000Å–4000Å would work as well). Other materials could be used instead of TiN such as W, TiW, TiWN, TiC, WC and any combination of any of the aforementioned materials. Other structures and combinations for metallization layer 120 could be used as well as would be known to those of ordinary skill in the art.

Next, an interlayer dielectric layer 130 (ILD) of thickness in the range of 3000Å–10000Å with 6000Å presently preferred is laid down, preferably with a PECVD process. Presently preferred for the ILD is a PECVD oxide, although other materials and processes could be used as known by those of skill in the art.

After completion of ILD 130, two types of cell openings or "vias" may be made in ILD 130 for further processing. Via 132 represents a first type of cell opening through the top of ILD 130 down to TiN layer 128 which, according to this embodiment, acts as an etch stop. Preferably the cell openings are of diameter 8000Å (0.8Å) or less. Via 134 represents a second type of cell opening through the entire thickness of ILD 130 as shown to provide access to first metallization layer 120. Preferably these cell openings are also of diameter 8000Å (0.8µ) or less.

The next step involves depositing an electrically conductive material 136 within the cell openings in order to provide an electrically conductive link through the ILD to the base or bottom of the antifuse material layer yet to be deposited. Presently preferred is CVD tungsten, a commercially available process which can be used to fill vias 132 and 134. CVD tungsten adheres nicely to the TiN at layer 128 and may be chem-mechanically polished along with ILD 130 to provide a planar surface 138 upon which further processing may take place. Other electrically conductive materials for which CVD processes are or become available may be used in place of CVD tungsten. Moreover, sputter deposition may also be used in place of CVD tungsten to deposit desired electrically conductive materials within vias 132 and 134.

Optionally, the electrically conductive material layer 136 within cell opening 132 may not come up all the way to the top of ILD 130 as shown by the dashed line 140 and above the dashed line may be disposed an electrically conductive barrier layer 142 of TiN of thickness in the range of 1000Å–4000Å with 2000Å being presently preferred. Other materials could be used instead of TiN such as W, TiW, TiWN, TiC, WC and any combination of any of the aforementioned materials. This barrier layer 142 may be needed in some configurations as would be recognized by those of ordinary skill in the art. Where it is not needed, it may be omitted.

A chem-mechanical polishing step or other planarizing step is then performed to provide a flat processing surface 138.

On top of planar surface 138 is disposed an antifuse material layer 144 which, as discussed before, may be any of a number of antifuse structures but is preferably a three layer N-A-N sandwich comprising a first nitride layer 146, an a-Si layer 148 and a second nitride layer 150. According to this embodiment, first nitride layer 146 is preferably of thickness 30Å–300Å with 100Å presently preferred; a-Si layer 148 is preferably of thickness 100Å–1000Å with 400Å presently preferred; and second nitride layer 150 is preferably of thickness 30Å–300Å with 100Å presently preferred. On top of antifuse material layer 144 is preferably disposed a barrier layer 152 which prevents migration of aluminum from the second metallization layer into the antifuse material layer 144. Barrier layer 152 should be electrically conductive. Presently preferred for barrier layer 152 is a layer of TiN of thickness in the range of 1000Å–4000Å with 2000Å presently preferred. The antifuse material layer(s) is then etched back to the ILD 130 at surface 138 in a conventional manner. As can be seen at 154 this process may etch back the CVD tungsten layer 136 within via 134 a bit without damage. Where a-Si is contained in antifuse material layer 144 and no barrier layer is provided under aluminum layer 158, side spacers should be added to the right and to the left of antifuse material layer 144 to protect the a-Si from diffusion from the aluminum in layer 158. Such spacers are well known to those of ordinary skill in the art and may be fabricated of a non-conductive material such as silicon dioxide. Where an appropriate barrier layer is provided under aluminum layer 158, no such spacers are required. An appropriate barrier layer is not shown in FIG. 4, but would be similar to a barrier layer such as layer 112 in FIG. 3.

The next step in the processing is to deposit the second metallization layer 156 as shown. Second metallization layer 156 preferably comprises a two-metal sandwich comprising a first aluminum layer 158 which is preferably of thickness about 4000Å (a thickness within the range of 3000Å–7000Å would work as well) and an ARC layer 160 which is preferably a layer of TiN of thickness in the range of 200Å–1000Å with 500Å presently preferred. Further processing may be carried out above ARC layer 160 or the structure may be capped with an appropriate passivation layer as known to those of ordinary skill in the art.

The following are also presently preferred structures for antifuse material layers which may be substituted into the structure of FIG. 2:

(1) a layer of a nitride of thickness 40Å–400Å (300Å preferred) over a layer of a-Si of thickness 100Å–500Å (300Å preferred);

(2) a layer of a nitride of thickness 40Å–300Å (100Å preferred) under a layer of an oxide of thickness 40Å–300Å (100Å preferred) under a layer of a nitride of thickness 40Å–600Å (100Å preferred) optionally under a layer of TiN of thickness 500Å–3000Å (1000Å preferred);

(3) a layer of an oxide of thickness 100Å–500Å (300Å preferred) optionally under a layer of TiN of thickness 500Å–3000Å (1000Å preferred);

(4) (this version must be on a barrier layer—1000Å–4000Å, (2000Å preferred) of TiN is preferred) a layer of an oxide of thickness 100Å–500Å (300Å preferred) under a layer of a nitride of thickness 10Å–500Å (100Å preferred) under a layer of TiN and/or Ti of thickness 200Å–4000Å (1000Å preferred).

The following are also presently preferred structures for antifuse material layers which may be substituted into the structure of FIG. 3:

(1) a layer of a nitride of thickness 40Å–400Å (300Å preferred) under a layer of a-Si of thickness 100Å–500Å (300Å preferred) which has been turned to a conductive metal silicide;

(2) a layer of a nitride of thickness 40Å–300Å (100Å preferred) under a layer of an oxide of thickness 40Å–300Å (100Å preferred) under a layer of a nitride of thickness 40Å–300Å (100Å preferred) under a layer of a-Si of thickness 100Å–500Å (300Å preferred) which has been turned to a conductive metal silicide.

The following are also presently preferred structures for antifuse material layers which may be substituted into the structure of FIG. 4:

(1) A layer of a-Si of thickness 40Å–1000Å (400Å preferred) under a layer of a nitride of thickness 50Å–500Å (200Å preferred);

(2) a layer of a nitride of thickness 50Å–500Å (200Å preferred) under a layer of a-Si of thickness 40Å–1000Å, (400Å preferred);

(3) a layer of a nitride of thickness 40Å–400Å (100Å preferred) under a layer of a-Si of thickness 50Å–1000Å (400Å preferred) under a layer of a nitride of thickness 40Å–400Å (100Å preferred);

(4) a layer of a nitride of thickness 30Å–300Å (100Å preferred) under a layer of an oxide of thickness 30Å–300Å (100Å preferred) under a layer of a nitride of thickness 30Å–300Å (100Å preferred);

(5) a layer of an oxide of thickness 30Å–300Å, (100Å preferred) under a layer of a nitride of thickness 30Å–300Å (100Å preferred) under a layer of an oxide of thickness 30Å–300Å (100Å preferred);

(6) a layer of a nitride of thickness 100Å–500Å (300Å preferred);

(7) a layer of an oxide of thickness 100Å–500Å (300Å preferred);

(8) a layer of a nitride of thickness 30Å–300Å (150Å preferred) under a layer of an oxide of thickness 30Å–300Å (150Å preferred);

(9) a layer of an oxide of thickness 30Å–300Å (150Å preferred) under a layer of a nitride of thickness 30Å–300Å (150Å preferred).

The above-described structures are particularly useful for three or more metallization layer semiconductor fabrication techniques. Each of the aforementioned layers is preferably disposed in planar fashion over the integrated circuit in a controlled fashion so as to yield predictable and known layer thicknesses as is well known to those of ordinary skill in the art. The methods used to dispose the various layers set forth above are all well known to those of ordinary skill in the art and are commercially available from commercial semiconductor processing facilities and are accordingly not set forth herein in great detail in order to avoid over complicating the disclosure.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. An electrically programmable antifuse disposed on an integrated circuit comprising:

a first metalization layer disposed on an insulating portion of said integrated circuit;

an interlayer dielectric layer disposed over said first metalization layer;

a via having substantially parallel sidewalls completely penetrating said interlayer dielectric layer and exposing said first metalization layer;

a layer of an electrically conductive material disposed in said via and in electrical contact with said first metalization layer, said electrically conductive material filling said via;

a flat planar antifuse material layer disposed over said layer of electrically conductive material, said antifuse material layer including a layer of amorphous silicon sandwiched between a first and a second layer of an insulating material other than amorphous silicon; and a second metalization layer disposed over said antifuse material layer.

2. An antifuse according to claim 1 wherein said insulating material is silicon nitride.

3. An antifuse according to claim 2 further comprising an etch-stop/barrier layer disposed over said antifuse material layer.

4. An antifuse according to claim 3 wherein said etch-stop/barrier layer is fabricated of a material selected from the group consisting of: TiN, TiW, TiWN, W, TiC, WC and combinations of two or more of any of the foregoing materials.

5. An electrically programmable antifuse disposed on an integrated circuit comprising:

a first metalization layer disposed on an insulating portion of said integrated circuit;

an interlayer dielectric layer disposed over said first metalization layer;

a via having substantially parallel sidewalls completely penetrating said interlayer dielectric layer and exposing said first metalization layer;

a layer of an electrically conductive material disposed in said via and in electrical contact with said first metalization layer;

an electrically conductive barrier layer disposed in said via over said layer of electrically conductive material, said electrically conductive barrier layer filling said via;

a flat planar antifuse material layer disposed over said layer of electrically conductive material and in contact with said electrically conductive barrier layer, said antifuse material layer including a layer of amorphous silicon sandwiched between a first and a second layer of an insulating material other than amorphous silicon; and a second metalization layer disposed over said antifuse material layer.

6. An antifuse according to claim 5 wherein said insulating material is silicon nitride.

7. An antifuse according to claim 6 further comprising an etch-stop/barrier layer disposed over said antifuse material layer.

8. An antifuse according to claim 7 wherein said etch-stop/barrier layer is fabricated of a material selected from the group consisting of: TiN, TiW, TiWN, W, TiC, WC and combinations of two or more of any of the foregoing materials.

* * * * *

UNITED STATES PATENT AND TRADEMARK OFFICE
CERTIFICATE OF CORRECTION

PATENT NO. : 5,763,898
DATED : June 9, 1998
INVENTOR(S) : Abdul R. Forouhi, Frank W. Hawley, John L. McCollum, Yeouchung Yen It is certified that error appears in the above-identified patent and that said Letters Patent is hereby corrected as shown below:

At Col. 1, line 11, after "5,404,029" and before "of which", delete "currently pending,".

At Col. 4, line 5, replace "invention to" with --invention is to--.

At Col. 5, line 33, replace "metalization" with --first metalization--.

At Col. 6, line 35, replace "TIWN" with --TiWN--.

At Col. 7, line 13, replace "metalization" with --first metalization--.

At Col. 7, line 42, replace "ILD 90" with --ILD layer 90--.

At Col. 7, line 43, replace "ILD 90" with --ILD layer 90--.

At Col. 7, line 46, replace "cell opening" with --via--.

At Col. 7, line 50, replace "ILD 90" with --ILD layer 90--.

At Col. 7, line 53, replace "dielectric" with --ILD--.

At Col. 8, line 8, replace "Ti+XSi>TiSi$_x$" with --Ti + Xsi → TiSi$_x$--.

At Col. 8, line 46, replace "TIWN" with --TiWN--.

At Col. 9, line 23, replace "TIWN" with --TiWN--.

At Col. 9, line 49, replace "(0.8Å)" with --(0.8μ)--.

UNITED STATES PATENT AND TRADEMARK OFFICE
CERTIFICATE OF CORRECTION

PATENT NO. : 5,763,898

DATED : June 9, 1998

INVENTOR(S) : Abdul R. Forouhi, Frank W. Hawley, John L. McCollum, Yeouchung Yen It is certified that error appears in the above-identified patent and that said Letters Patent is hereby corrected as shown below:

At Col. 12, line 3, replace "over complicating" with --over-complicating--.

Signed and Sealed this

Twenty-second Day of December, 1998

*Attest:*

BRUCE LEHMAN

*Attesting Officer*   *Commissioner of Patents and Trademarks*